US008395392B2

(12) United States Patent
Simin et al.

(10) Patent No.: US 8,395,392 B2
(45) Date of Patent: Mar. 12, 2013

(54) PARAMETER EXTRACTION USING RADIO FREQUENCY SIGNALS

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 293 days.

(21) Appl. No.: 12/646,121

(22) Filed: Dec. 23, 2009

(65) Prior Publication Data
US 2010/0156442 A1  Jun. 24, 2010

Related U.S. Application Data

(60) Provisional application No. 61/203,505, filed on Dec. 23, 2008.

(51) Int. Cl.
*G01R 31/08* (2006.01)
*G01R 27/00* (2006.01)
*G01R 27/04* (2006.01)

(52) U.S. Cl. .......................... 324/525; 324/600; 324/638

(58) Field of Classification Search .................. 324/525, 324/600, 605–611, 637–638
See application file for complete search history.

(56) References Cited

U.S. PATENT DOCUMENTS

| | | | |
|---|---|---|---|
| 4,638,341 A | 1/1987 | Baier et al. | |
| 5,126,284 A | 6/1992 | Curran | |
| 5,196,907 A | 3/1993 | Birkle et al. | |
| 5,241,193 A | 8/1993 | Pfiester et al. | |
| 5,552,714 A * | 9/1996 | Adamian et al. | 324/601 |
| 6,207,584 B1 | 3/2001 | Shen et al. | |
| 6,285,042 B1 | 9/2001 | Ohtani et al. | |
| 6,538,538 B2 * | 3/2003 | Hreish et al. | 333/246 |
| 6,589,822 B1 | 7/2003 | Yamazaki et al. | |
| 6,690,042 B2 | 2/2004 | Khan et al. | |
| 6,690,176 B2 * | 2/2004 | Toncich | 324/629 |
| 6,759,839 B2 * | 7/2004 | Kodato | 324/95 |
| 6,812,714 B2 * | 11/2004 | Verspecht et al. | 324/638 |
| 6,878,593 B2 | 4/2005 | Khan et al. | |
| 6,903,385 B2 | 6/2005 | Gaska et al. | |
| 6,998,833 B2 * | 2/2006 | Wang et al. | 324/76.12 |
| 7,248,866 B1 * | 7/2007 | Tsironis | 455/423 |
| 7,282,911 B2 * | 10/2007 | Xiang et al. | 324/304 |
| 7,548,069 B2 * | 6/2009 | Simpson | 324/537 |
| 8,203,347 B2 * | 6/2012 | Nakayama et al. | 324/601 |
| 8,203,348 B1 * | 6/2012 | Tsironis | 324/638 |
| 2001/0009785 A1 | 7/2001 | Arafa et al. | |
| 2004/0036086 A1 | 2/2004 | Khan et al. | |
| 2004/0061129 A1 | 4/2004 | Saxler et al. | |

(Continued)

FOREIGN PATENT DOCUMENTS

JP  2007048866  2/2007

OTHER PUBLICATIONS

Bradley Smith, "Office Action", U.S. Appl. No. 11/781,308, Notification Date: Apr. 6, 2009, 9 pages.

(Continued)

*Primary Examiner* — Joshua Benitez Rosario
(74) *Attorney, Agent, or Firm* — John W. LaBatt (57) ABSTRACT

A set of parameters of an evaluation structure are extracted by applying a radio frequency (RF) signal through a first capacitive contact and a second capacitive contact to the evaluation structure. Measurement data corresponding to an impedance of the evaluation structure is acquired while the RF signal is applied, and the set of parameters are extracted from the measurement data. In an embodiment, multiple pairs of capacitive contacts can be utilized to acquire measurement data. Each pair of capacitive contacts can be separated by a channel having a unique spacing.

21 Claims, 5 Drawing Sheets

U.S. PATENT DOCUMENTS

| | | | |
|---|---|---|---|
| 2005/0001234 | A1 | 1/2005 | Inoue et al. |
| 2005/0173728 | A1 | 8/2005 | Saxler |
| 2005/0274977 | A1 | 12/2005 | Saito et al. |
| 2006/0235638 | A1* | 10/2006 | Verspecht ............... 702/118 |
| 2006/0279275 | A1* | 12/2006 | Simpson ............... 324/158.1 |
| 2007/0278518 | A1 | 12/2007 | Chen et al. |
| 2007/0295993 | A1 | 12/2007 | Chen et al. |
| 2008/0272397 | A1 | 11/2008 | Koudymov et al. |
| 2009/0008804 | A1 | 1/2009 | Standing et al. |
| 2010/0026315 | A1* | 2/2010 | Simpson ............... 324/600 |
| 2010/0156475 | A1 | 6/2010 | Simin et al. |

OTHER PUBLICATIONS

Matthew E. Gordon, "Office Action", U.S. Appl. No. 11/781,302, Notification Date: May 1, 2009, 12 pages.

Matthew E. Gordon, "Office Action", U.S. Appl. No. 11/781,302, Notification Date: Mar. 8, 2010, 13 pages.

Matthew E. Gordon, "Final Office Action", U.S. Appl. No. 11/781,302, Notification Date: Aug. 17, 2010, 13 pages.

Raj R. Gupta, "Office Action", U.S. Appl. No. 11/781,338, Notification Date: Mar. 6, 2009, 18 pages.

Raj R. Gupta, "Final Office Action", U.S. Appl. No. 11/781,338, Notification Date: Jul. 10, 2009, 15 pages.

Matthew E. Gordon, "Final Office Action", U.S. Appl. No. 11/781,302, Notification Date: Nov. 17, 2009, 23 pages.

Bradley Smith, "Notice of Allowance", U.S. Appl. No. 11/781,308, Date Mailed: Oct. 20, 2009, 13 pages.

Raj R. Gupta, "Notice of Allowance", U.S. Appl. No. 11/781,338, Date Mailed: Sep. 16, 2009, 10 pages.

Jon Kwon Kim, "PCT International Search Report and Written Opinion", PCT Application No. PCT/US2008/054368, Date of Completion: Jul. 30, 2008, 10 pages.

Sungjae Lee et al., "Record RF performance of 45-nm SOI CMOS Technology", IEDM Technical Digest, pp. 255-258, Copyright 2007.

R. Lai et al., "Sub 50 nm InP HEMT Device with Fmax Greater than 1 THz", IEDM Technical Digest, pp. 609-611, IEEE, Copyright 2007.

Zukauskas et al., "Solid State Lighting", Copyright Wiley 2002, http://nina.ecse.rpi.edu/shur/, 132 pages.

Koudymov et al., "RF Transmission Line Method for Wide-Bandgap Heterostructures", IEEE Electron Device Letters, vol. 30, No. 5, pp. 433-435, May 2009.

Simin et al., "III-Nitride Transistors with Capacitively Coupled Contacts", Applied Physics Letters 89, 033510, pp. 1-3, 2006.

Simin et al., "RF-Enhanced Contacts to Wide-Bandgap Devices", IEEE Electron Device Letters, vol. 28, No. 1, pp. 2-4, Jan. 2007.

Stillman et al., "Closing the Gap: Plasma Wave Electronic Terahertz Detectors", Journal of Nanoelectronics and Optoelectronics, vol. 2, No. 3, pp. 209-221, Dec. 2007.

Foutz et al., "Transient Electron Transport in Wurtzite GaN, InN, and AIN", Journal of Applied Physics, vol. 85, No. 11, pp. 7727-7734, Jun. 1, 1999.

G. Simin, "Wide Bandgap Devices with Non-Ohmic Contacts", ECS 2006—210th Meeting of the Electrochemical Society, Cancun, Mexico, Oct. 29-Nov. 3, 2006, 7 pages.

Pala et al., "Drain-to-Gate Field Engineering for Improved Frequency Response of GaN-based HEMTs", IEEE, 2007, 2 pages.

Turin et al., "Simulations of Field-Plated and Recessed Gate Gallium Nitride-Based Heterojunction Field-Effect Transistors", International Journal of High Speed Electronics and Systems, vol. 17, No. 1, pp. 19-23, 2007.

Mayo Clinic, "HRL InP NMIC GHz", http://www.mayo.edu/sppdg/packaging_development.html, 2 pages.

Simin et al., "High-Power III-Nitride Integrated Microwave Switch with Capacitively-Coupled Contacts", IEEE 2007, pp. 457-460.

Hess and Brennan (1984), Handbook of Semiconductor Parameters, "7.3.2. Transport Properties in High Electric Field", vol. 1, p. 156.

Arora, Ajay, USPTO Office Action, U.S. Appl. No. 12/645,876, Notification Date Jan. 3, 2012, 16 pages.

Gordon, U.S. Appl. No. 11/781,302, Office Action Communication, Jun. 27, 2012, 19 pages.

Arora, U.S. Appl. No. 12/645,876, Notice of Allowance & Fees Due, Aug. 21, 2012, 14 pages.

Kim, International application No. PCT/US2012/025146, International Search Report and the Written Opinion of the International Searching Authority, Aug. 1, 2012, 9 pages.

Gordon, U.S. Appl. No. 11/781,302, Office Action Communication, SETI-0033, Oct. 12, 2012, 19 pages.

\* cited by examiner

PARAMETER EXTRACTION USING RADIO FREQUENCY SIGNALS

REFERENCE TO PRIOR APPLICATIONS

The current application claims the benefit of co-pending U.S. Provisional Application No. 61/203,505, titled "Radio-frequency transmission line model method and structure for semiconductor material and device characterization", which was filed on 23 Dec. 2008, and which is hereby incorporated by reference.

Aspects of the application are also related to co-pending U.S. Utility application Ser. No. 11/781,302, titled "Composite contact for semiconductor device", which was filed on 23 Jul. 2007, co-pending U.S. Utility application Ser. No. 11/781,308, titled "Fabrication of semiconductor device having composite contact", which was filed on 23 Jul. 2007, and co-pending U.S. Utility application Ser. No. 11/781,338, titled "Enhancement mode insulated gate heterostructure field-effect transistor", which was filed on 23 Jul. 2007, each of which is hereby incorporated by reference.

TECHNICAL FIELD

The disclosure relates generally to parameter extraction, and more particularly, to parameter extraction of an evaluation structure using radio frequency signals.

BACKGROUND ART

Figure 1:
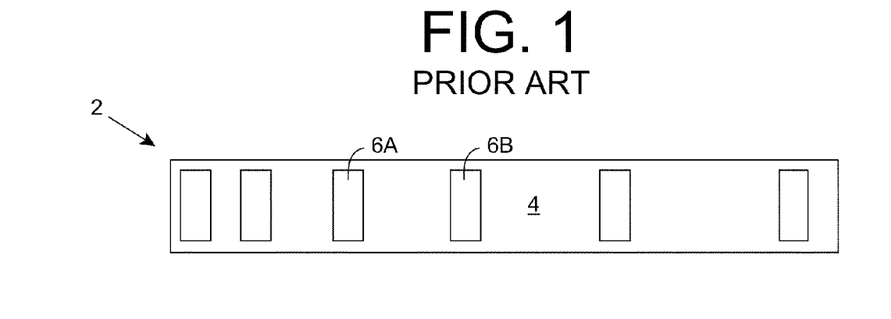
FIG. 1 shows a schematic of a TLM test structure according to the prior art.

Semiconductor device technology requires accurate methods to characterize the semiconductor film and contact resistances. A transmission line model (TLM) test structure is conventionally used to extract these parameters. FIG. 1 shows a schematic of a TLM test structure 2 according to the prior art. The TLM test structure 2 includes a defined area of a semiconductor film 4 subject to characterization with a number of identical but differently spaced ohmic contacts, such as ohmic contacts 6A, 6B, formed on a surface of the semiconductor film 4. The TLM test structure 2 requires low-resistive highly-linear ohmic contacts 6A, 6B to extract accurate material parameters. One challenge to the development, characterization and optimization of wide bandgap heterostructures, such as high-Aluminum (Al) content AlGaN/GaN, is the formation of ohmic contacts 6A, 6B. In particular, the high temperatures required during annealing lead to substantial structural damage, increased roughness and changes the surface of the heterostructure, resulting in reduced sheet carrier concentration and mobility.

Capacitively-coupled contacts do not require annealing. Capacitively-coupled contact electrodes have very low contact impedance when the operating frequency is sufficiently high. In high frequency operations, capacitively-coupled contacts have been used in place of ohmic contacts.

SUMMARY OF THE INVENTION

Aspects of the invention provide a solution in which a set of parameters of an evaluation structure are extracted by applying a radio frequency (RF) signal through a first capacitive contact and a second capacitive contact to the evaluation structure. Measurement data corresponding to an impedance of the evaluation structure is acquired while the RF signal is applied, and the set of parameters are extracted from the measurement data. In an embodiment, multiple pairs of capacitive contacts can be utilized to acquire measurement data. Each pair of capacitive contacts can be separated by a channel having a unique spacing.

A first aspect of the invention provides a method of extracting a set of parameters of an evaluation structure, the method comprising: applying a first radio frequency (RF) signal through a first capacitive contact and a second capacitive contact to the evaluation structure, wherein the first and second capacitive contacts are separated by a first channel having a first spacing; acquiring measurement data corresponding to an impedance between the first and second capacitive contacts using the first and second capacitive contacts while the first RF signal is applied; and extracting the set of parameters from the measurement data.

A second aspect of the invention provides a test structure comprising: a dielectric; a test element formed on the dielectric, the test element including: a radio frequency (RF) input capacitive contact formed on a surface of the dielectric; and a RF output capacitive contact formed on the surface of the dielectric, wherein the first and second capacitive contacts are separated by a first channel having a first spacing; a RF signal source electrically attached to the RF input capacitive contact; and a RF load electrically attached to the RF output capacitive contact.

A third aspect of the invention provides a testing environment comprising: an evaluation structure; a radio frequency (RF) input capacitive contact applied to a surface of the evaluation structure; and a RF output capacitive contact applied to the surface of the evaluation structure, wherein the first and second capacitive contacts are separated by a first channel having a first spacing; a RF signal source electrically attached to the RF input capacitive contact; a RF load electrically attached to the RF output capacitive contact; and a measurement device configured to acquire measurement data corresponding to an impedance of the evaluation structure using the RF input and RF output capacitive contacts while the RF signal source applies an RF signal.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, a set of parameters of an evaluation structure are extracted by applying a radio frequency (RF) signal through a first capacitive contact and a second capacitive contact to the evaluation structure. Measurement data corresponding to an impedance of the evaluation structure is acquired while the RF signal is applied, and the set of parameters are extracted from the measurement data. In an embodiment, multiple pairs of capacitive contacts can be utilized to acquire measurement data. Each pair of capacitive contacts can be separated by a channel having a unique spacing. As a result, material properties can be accurately extracted without forming annealed ohmic contacts, thereby replacing the regular TLM technique with a RF solution for extracting parameters. It is understood that for the purposes of the present invention, Al means Aluminum, In means Indium, Ga means Gallium, N means Nitrogen, O means Oxygen, Hf means Hafnium, and Si means Silicon. As used herein, unless otherwise noted, the term "set" means one or more (i.e., at least one) and the phrase "any solution" means any now known or later developed solution.

Figure 2A:
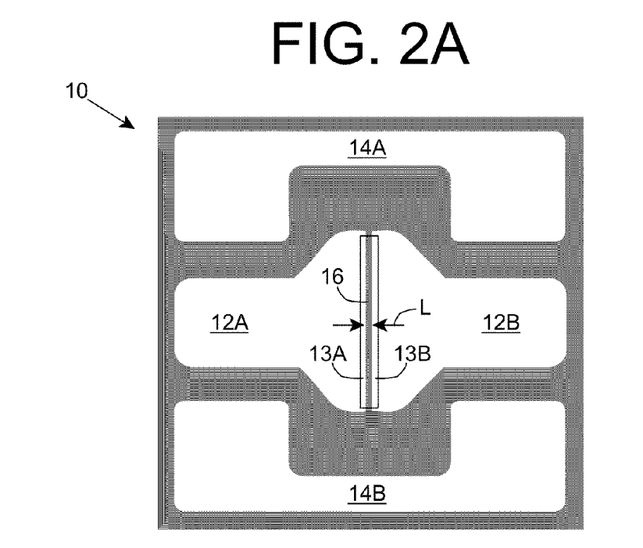
FIGS. 2A and 2B show an illustrative schematic layout and equivalent circuit, respectively, of a RF TLM test element according to an embodiment.
Figure 2B:
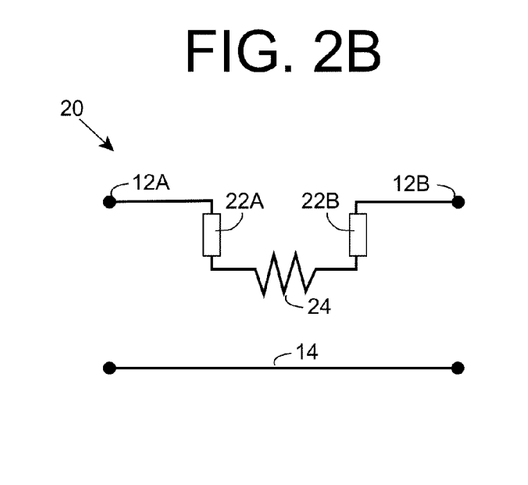

Turning to the drawings, FIGS. 2A and 2B show an illustrative schematic layout of a RF TLM test element 10 and equivalent circuit 20, respectively, according to an embodiment. Test element 10 is shown including a RF input electrode 12A, a RF output electrode 12B, and a pair of ground electrodes 14A, 14B. Test element 10 is applied to a surface of an evaluation structure, and utilized to extract a set of parameters of the evaluation structure using a RF TLM procedure.

The evaluation structure can comprise, for example, a semiconductor or a compound dielectric-semiconductor sample to be evaluated. In an illustrative embodiment, the evaluation structure comprises a semiconductor film deposited over a substrate. In another illustrative embodiment, the evaluation structure comprises a compound dielectric/semiconductor material including a semiconductor film deposited over a substrate. In another illustrative embodiment, the evaluation structure comprises a heterostructure including a barrier layer and a buffer layer forming a two-dimensional electron gas (2DEG) at the interface. In a more particular illustrative embodiment, the evaluation structure comprises a wide bandgap heterostructure, such as a high-Al content AlGaN/GaN heterostructure. Further, the evaluation structure can comprise a heterostructure with a dielectric layer formed over the barrier layer.

Each electrode 12A, 12B, 14A, 14B forms a capacitively coupled contact with the evaluation structure for use during the RF TLM procedure. The configuration of each electrode 12A, 12B, 14A, 14B can vary based on the configuration of the evaluation structure. For example, the evaluation structure can comprise a top semiconductor layer to which electrodes 12A, 12B, 14A, 14B are to be applied. In this case, each electrode 12A, 12B, 14A, 14B can comprise a metal, such as for example, titanium, aluminum, nickel, gold, and/or the like, and an insulating layer, such as for example, silicon dioxide, silicon nitride, aluminum oxide, and/or the like, applied to the metal. In use, the insulating layer of each electrode 12A, 12B, 14A, 14B is applied to a surface of the top semiconductor layer to form capacitive contacts to a conducting channel of the evaluation structure. Alternatively, the evaluation structure can comprise a top dielectric layer to which electrodes 12A, 12B, 14A, 14B are to be applied. In this case, each electrode 12A, 12B, 14A, 14B can comprise a metal. In either case, the evaluation structure can include one or more DC conducting contacts, over which one or more of the electrodes 12A, 12B, 14A, 14B is applied.

In any event, RF input and output electrodes 12A, 12B are separated by a channel 16 having a spacing L. In an embodiment, a RF TLM test structure includes a plurality of the test elements 10, each of which comprises a channel 16 of a different spacing L. However, it is understood that a test structure according to an embodiment can include a single test element 10. Spacing L can vary between approximately one hundred nanometers or less to approximately ten microns or more. In general, a longer test element 10 can be used when operated at lower frequencies.

As illustrated in FIG. 2B, channel 16 comprises a corresponding resistance 24, $R_{CH}$, and an edge portion 13A, 13B of each RF input and output electrode 12A, 12B, respectively, has a corresponding impedance 22A, 22B, $Z_C$.

Figure 3:
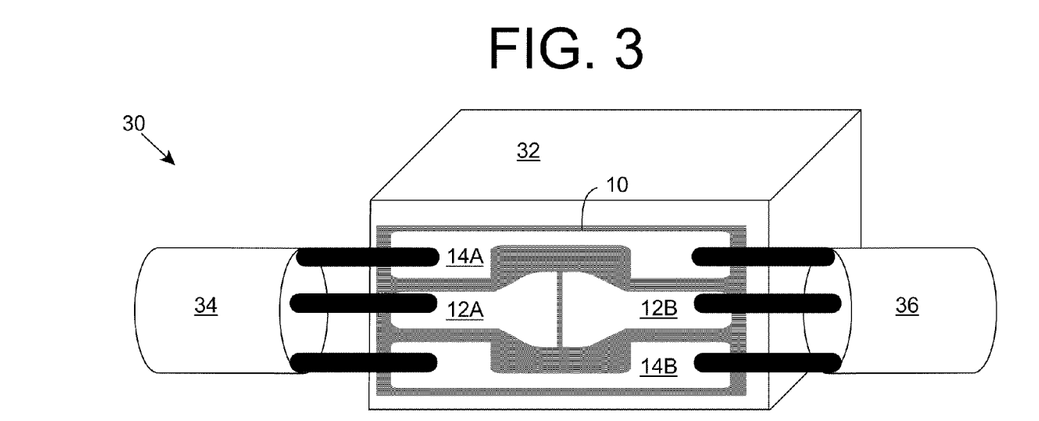
FIG. 3 shows a schematic layout of an illustrative parameter extraction structure including the RF TLM test element of FIG. 2A according to an embodiment.

FIG. 3 shows a schematic layout of an illustrative parameter extraction structure 30 including the RF TLM test element 10 (FIG. 2A) according to an embodiment. Structure 30 comprises a dielectric holder 32 on which test element 10 is formed. The dielectric holder 32 can comprise any type of insulating material, such as polychlorinated biphenyls (PCB), or the like.

Additionally, structure 30 comprises a RF signal source 34, which is electrically attached to RF input electrode 12A, and a RF load 36, which is electrically attached to RF output electrode 12B. RF input electrode 12A can be connected to the RF signal source 34 and RF output electrode 12B can be connected to a RF load 34, e.g., by using RF probes, RF cables, wire-bonding, soldering, or any other type of RF connections.

Figure 4A:
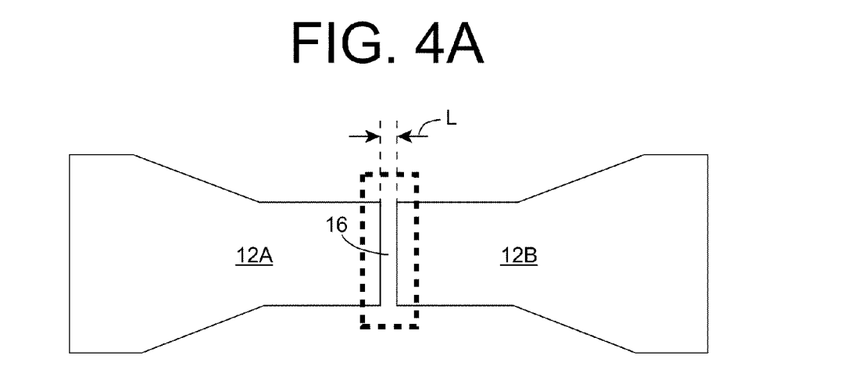
FIGS. 4A, 4B show top and side schematic views, respectively, of an alternative configuration of the electrodes for use in RF TLM parameter extraction according to an embodiment.
Figure 4B:
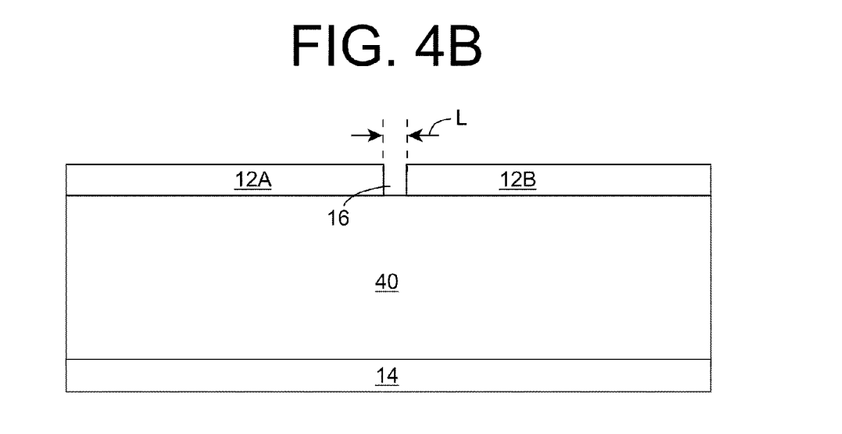

It is understood that structure 30 and test element 10 are only illustrative embodiments of various configurations for use in extracting a set of parameters of an evaluation structure using radio frequency signals. For example, FIGS. 4A and 4B show top and side schematic views, respectively, of an alternative configuration of the electrodes for use in RF TLM parameter extraction according to an embodiment. As illustrated, RF input electrode 12A and RF output electrode 12B are applied to a first (e.g., top) surface of an evaluation structure 40, while a single ground electrode 14 is applied to an opposing (e.g., bottom) surface of the evaluation structure 40. The evaluation structure 40 can comprise, for example, a semiconductor or a compound dielectric-semiconductor sample to be evaluated. In this case, a microstrip-type transmission line is formed.

Figure 5:
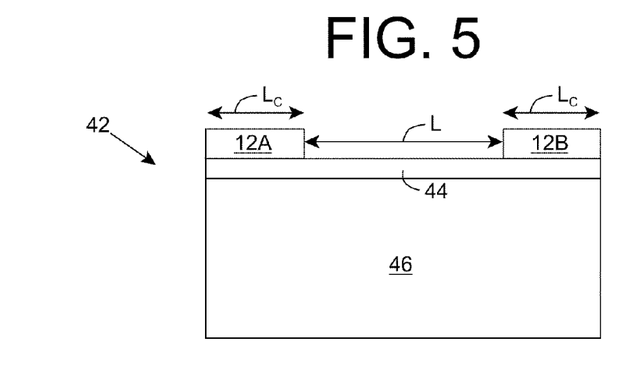
FIG. 5 shows a cross-sectional view of another illustrative configuration of the RF input and output electrodes for use in RF TLM parameter extraction according to another embodiment.

FIG. 5 shows a cross-sectional view of another illustrative configuration of the RF input electrode 12A and RF output electrode 12B for use in RF TLM parameter extraction according to another embodiment. In particular, an evaluation structure 42 comprises a compound dielectric-semiconductor multilayer structure, which comprises a dielectric layer 44 and a semiconductor 46. RF input and output electrodes 12A, 12B are applied to a surface of the dielectric layer 44 to form the capacitively coupled contacts.

Returning to FIG. 3, structure 30 and test element 10 can be used in a process to extract a set of parameters of a corresponding evaluation structure using radio frequency (e.g., microwave frequency) signals (e.g., a RF TLM parameter extraction process). The evaluation structure can comprise one or more layers of any type of semiconductor or composite semiconductor material. In an embodiment, the evaluation structure comprises a semiconductor film. In another embodiment, the evaluation structure comprises a compound dielectric-semiconductor structure.

In any event, one or more test elements 10, each having a channel 16 of a different spacing L, can be applied to a surface of an area of the evaluation structure to be characterized. For example, structure 30 can be used to mechanically attach (e.g., press, overlay, or the like) the test element 10 to a surface of the evaluation structure. Alternatively, the electrodes 12A, 12B, 14A, 14B can be formed on a surface of the evaluation structure, e.g., using a microelectronic technology, such as directly depositing the electrodes 12A, 12B, 14A, 14B using any type of metal deposition technique and photolithography, or the like. Regardless, once applied, test element 10 and the evaluation structure form the required system of capacitively coupled contact electrodes.

The RF signal source 34 can generate a RF signal, which is applied between the RF input and output electrodes 12A, 12B of the test element 10. The frequency of the RF signal can range between, for example, hundreds of megahertz to tens or hundreds of gigahertz. The amplitude of the RF signal can be much smaller than a knee voltage and knee current of the corresponding evaluation structure. While the RF signal is being applied, measurement data corresponding to a high frequency impedance between the RF input electrode 12A and the RF output electrode 12B can be acquired. The measurement data can be used to extract a set of parameters for the structure. For example, the high frequency impedance can be determined and used to extract a resistance of the structure in the open areas and under the metal RF input and output electrodes 12A, 12B, as well as an electrode-structure capacitance.

Figure 6:
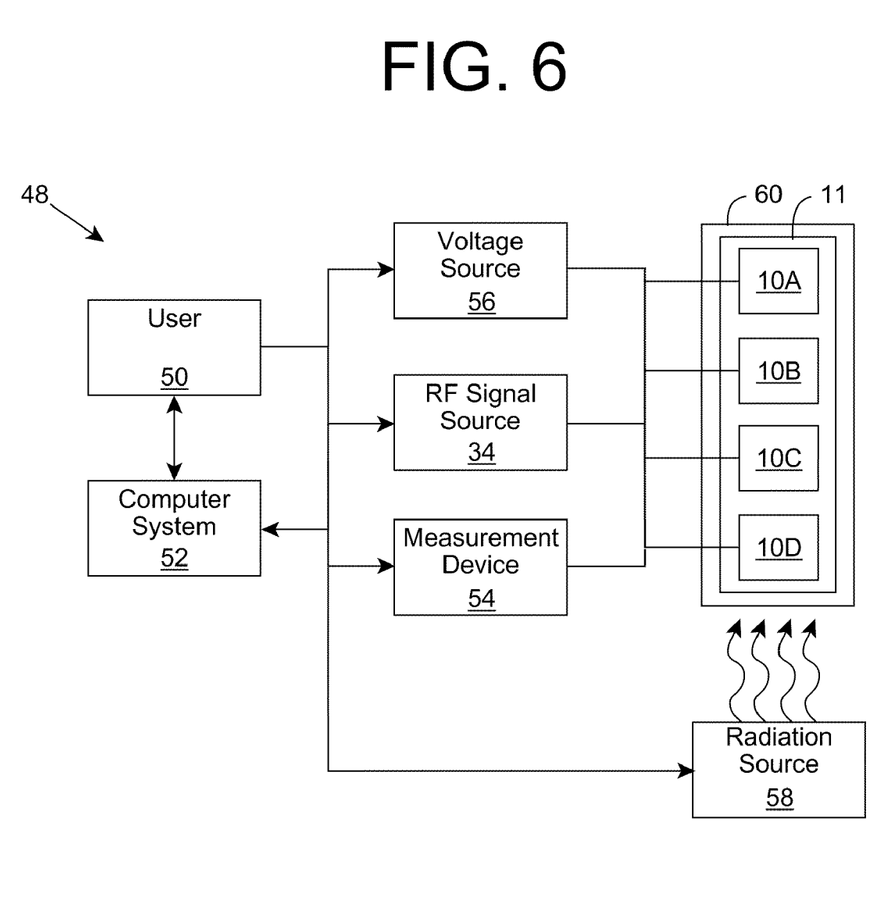
FIG. 6 shows an illustrative test environment according to an embodiment.

FIG. 6 shows an illustrative test environment 48 according to an embodiment. Environment 48 comprises a user 50 and a computer system 52. User 50 and/or computer system 52 can perform a process to extract a set of parameters of an evaluation structure 60 using any manual, automated, or semi-automated solution. To this extent, alternative test environments 48 can be implemented without user 50 or computer system 52.

Computer system 52 can comprise one or more of any type of computing devices, which is/are configured to implement a process described herein for extracting a set of parameters of an evaluation structure. To this extent, computer system 52 can comprise a general purpose computing device, which includes a processing component, a storage component, and an input/output component. The storage component can include a computer program stored thereon, which when executed by the processing component, enables computer system 52 to perform a series of actions to implement a process described herein for extracting a set of parameters of an evaluation structure. The actions can include operating one or more components of environment 48 and/or receiving data from one or more components of environment 48 via the input/output component. Further, computer system 52 can be configured to manage data acquired during the process (e.g., by storing the data in one or more data files, performing one or more calculations on the data, and/or the like) and can manage one or more interfaces to enable user 50 to interact with the data and/or assist in performing the process (e.g., when a semi-automated process is employed).

In any event, user 50 and/or computer system 52 can operate a RF signal source 34 to apply a RF signal to one or more test elements 10A-10D, e.g., a RF input electrode 12A (FIG. 2A), of a test structure 11 applied to a surface of the evaluation structure 60. User 50 and/or computer system 52 can operate a measurement device 54 to acquire data corresponding to a high frequency impedance of the evaluation structure 60 while the RF signal source 34 is applying the RF signal. Measurement device 54 can provide the measurement data for use by user 50 and/or computer system 52. User 50 and/or computer system 52 can extract a set of parameters for the evaluation structure 60 from the measurement data.

In addition to applying a RF signal, user 50 and/or computer system 52 can perform one or more additional actions with respect to test structure 11 and/or evaluation structure 60 while the measurement data is acquired. For example, environment 48 is shown including a voltage source 56, which user 50 and/or computer system 52 can operate to bias one or more RF input and output electrodes 12A, 12B of a test element 10A-10B. For example, voltage source 56 can apply a DC voltage bias or a RF voltage bias, which can be modulated, while the RF signal is applied and the measurement data is acquired. The voltage bias can range from voltages much smaller than the knee voltage of the transistor formed with evaluation structure 60 to voltages well exceeding the knee voltage. This allows for evaluation of the effects of the current crowding and/or velocity saturation on the evaluation structure 60.

Similarly, environment 48 is shown including a radiation source 58, which user 50 and/or computer system 52 can operate to radiate evaluation structure 60 while the RF signal is applied and the measurement data is acquired. The radiation can be used to modulate one or more parameters of the evaluation structure 60. In general, the RF amplitude of the radiation can be much smaller than the knee voltage for the transistor formed with evaluation structure 60 while basic measurement data is acquired. However, when acquiring non-linear measurements, the radiation can include RF amplitudes exceeding the knee voltage for the transistor formed with evaluation structure 60. This also allows for evaluation of the effects of the current crowding and/or velocity saturation on the evaluation structure 60.

In an embodiment, measurement device 54 measures the S-parameters of evaluation structure 60. Subsequently, measurement device 54 or computer system 52 can convert the S-parameters measurement data to ABCD parameters. For example, the impedance between RF input and output electrodes 12A, 12B can be calculated by:

$$Z(L) = Z_{CH}(L) + 2Z_C, \ Z_{CH} = R_{SH} \cdot L/W, \quad (1)$$

where $Z_{CH}$ is the channel impedance, $R_{SH}$ is the wafer sheet resistance, and L and W are the geometric parameters of the channel, e.g., the spacing L and the width of the channel. The impedance for each RF input and output electrode 12A, 12B, $Z_C = R_C - jX_C$, is the impedance of a capacitively coupled contact, which is the impedance of a lossy transmission line, and can be calculated by:

$$Z_C = Z_1 \coth(\gamma L_C), \quad (2)$$

$$Z_1 = \frac{1}{W} \sqrt{\frac{R_{SHC}}{j \cdot \omega C_1}},$$

$$\gamma = \sqrt{j \cdot R_{SHC} \cdot \omega C_1},$$

where $L_C$ is the contact length, $R_{SHC}$ is the sheet resistance of the semiconductor layer under the contact metal, $C_1$ is the geometric capacitance between the contact metal and semiconductor layer per unit area, and $\omega=2\pi f$, the angular frequency of the RF signal. From equation (2), at low frequencies, $\gamma L_C \ll 1$, and $$R_C \approx \frac{R_{SHC}}{3} \frac{L_C}{W};$$
$$X_C \approx \frac{1}{\omega C_0}, \qquad (3)$$

where $C_0$ is the geometrical capacitance between the contact and the channel. At high frequencies, $\gamma L_C \gg 1$, and $$R_C \approx X_C \approx \frac{1}{\sqrt{2}\,W} \sqrt{R_{SH}/(\omega C_1)}. \qquad (4)$$

In a RF setup such as environment 48, measurement device 54 can measure the S-parameters of two-port networks. To use the S-parameters measurement data for an RF TLM test, computer system 52 and/or user 50 can convert the S-parameters measurement data into an ABCD matrix and use the B-parameter of the ABCD matrix. The B-parameter can be found by $B=Z_S$, where $Z_S$ is the series impedance of the equivalent π- or single series element two-port network. In addition to being readily capable of extraction, the B-parameter of the ABCD matrix is independent of the impedances of any shunting components connected between the RF input and output electrodes 12A, 12B.

As a result, use of the B-parameter to extract a set of characteristics of the evaluation structure 60, is equivalent to de-embedding the series impedance, $Z_S$, of the test element 10. In the RF TLM test, the series impedance, $Z_S$, equals the test element 10 impedance: $Z_S=Z(L)$, e.g., see Equation (1). Therefore:

$$\mathrm{Re}(B)=2RC+RCH;\ \mathrm{Im}(B)=-2XC. \qquad (5)$$

The B-parameter can be found from the S-parameters as:

$$B = Z_0 \frac{(1+s_{11})(1+s_{22})-s_{12}s_{21}}{2s_{21}},$$

where $Z_0$ is the characteristic impedance of the RF line, typically, $Z_0=50\Omega$.

Referring to FIG. 5, in an illustrative example used to describe aspects of the invention further, the evaluation structure 42 comprises a HfO$_2$ dielectric layer 44 and a AlGaN/GaN heterostructure semiconductor 46. Three RF TLM test structures with RF input and output electrodes 12A, 12B having spacings L=5, 7.5, and 10 μm were applied to a surface of the dielectric layer 44 to form the capacitively coupled contacts. Various RF signals were provided by a RF signal source 34 (FIG. 6) and the B-parameter of the ABCD matrix was extracted.

Figure 7:
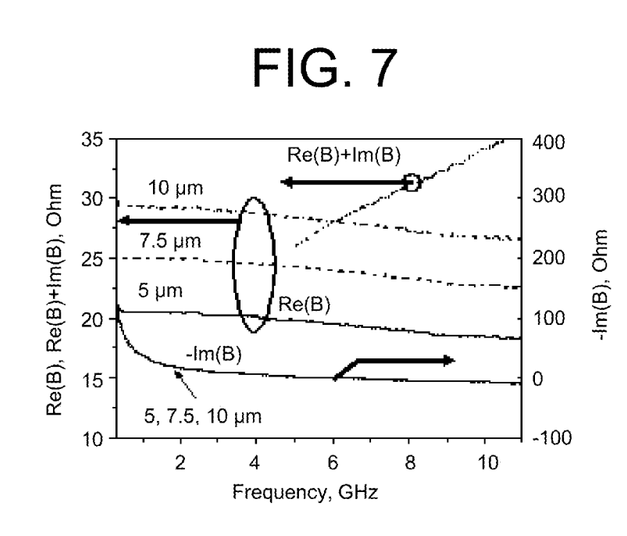
FIG. 7 shows the frequency dependence of the B-parameter of the ABCD matrix of an illustrative RF TLM test element according to an embodiment.

FIG. 7 shows the frequency dependence of the B-parameter of the ABCD matrix of the illustrative example according to an embodiment. In particular, FIG. 7 shows the real (Re(B)) and imaginary (Im(B)) parts of the extracted B-parameter for the three RF TLM test structures with the spacing L=5, 7.5, and 10 μm formed over the HfO$_2$/AlGaN/GaN heterostructure of the illustrative example. As illustrated, in the frequency range 0.4-4 GHz, Re(B) has negligible frequency dependence and Im(B) does not depend on the electrode spacing L. Im(B) can be used to extract the electrode-channel RF capacitance, which can differ from that obtained by C-V technique (typically at frequencies below 1 MHz) due to surface, bulk and interface charges.

To accurately extract the RF capacitance, a series parasitic inductance, $L_p$, can be assumed to be present in the experimental setup, which can be de-embedded using the following procedure. When $\gamma L_C \gg 1$, $R_C=X_C$ (see Equation (4)). Assuming $\mathrm{Im}(B)=-2X_C+\omega L_p$, $\mathrm{Re}(B)+\mathrm{Im}(B)=R_{CH}+\omega L_p$ and hence, $L_p$ can be found from the slope of the frequency dependence of $\mathrm{Re}(B)+\mathrm{Im}(B)$. The linearity of the $\mathrm{Re}(B)+\mathrm{Im}(B)$ with respect to frequency is an indication that the frequency range for the $L_p$ extraction is appropriate. Using typical AlGaN/GaN epilayer parameters $d_B=20$ nm, $\in_B=9$, and $L_C=10$ μm for the illustrative example, the high frequency limit holds at frequencies calculated by:

$$f \gg f_c = \frac{1}{2\pi R_{SHC} C_1 L_C^2} \approx 1.3\ \mathrm{GHz}$$

The frequency dependence $\mathrm{Re}(B)+\mathrm{Im}(B)$ is shown by dashed line in FIG. 7, yielding the parasitic inductance $L_p=0.2$ nH from a linear fitting. The reactive part of the contact impedance $X_C$ can be calculated by $-[\mathrm{Im}(B)-\omega L_p]$, which yields a contact capacitance $C_0=8.8$ pF for the illustrative example.

Additionally, an embodiment of the invention provides for independent extraction of the layer sheet resistance in the electrode openings and under the metal, as well as the electrode-channel capacitance using a single RF TLM test element. In particular, the wafer sheet resistance in the electrode opening $R_{SH}$ can be calculated from the $[\mathrm{Re}(B)+\mathrm{Im}(B)]$ versus frequency dependence extrapolation to f=0. Additionally, the electrode-channel unit-width capacitance $C_o$ can be calculated from the slope of $[\mathrm{Re}(B)+\mathrm{Im}(B)]$ versus frequency in the low frequency range (f≪$f_C$). Furthermore, the sheet resistance under the metal electrode $R_{SHC}$ can be calculated from the Im(B) values at high frequencies (f>$f_C$) and using $C_0$.

Figure 8:
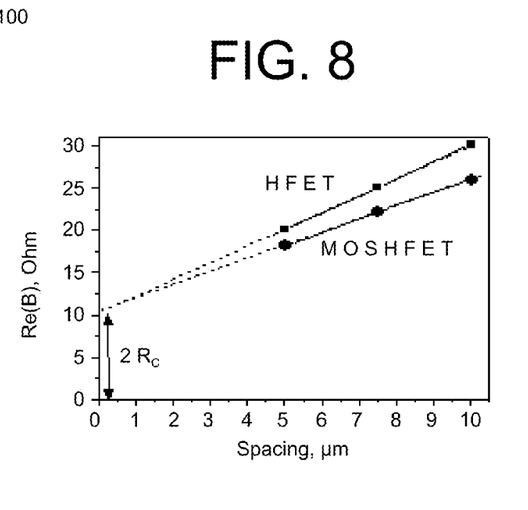
FIG. 8 shows the electrode spacing dependence of the real part of the B-parameter of the ABCD matrix of an illustrative RF TLM test element according to an embodiment.

FIG. 8 shows the electrode spacing L dependence of the real part of the B-parameter of the ABCD matrix of the illustrative example according to an embodiment. The real part of the B-parameter, Re(B), was measured while a one gigahertz signal was applied to the illustrative example. Using Equation (1), the channel sheet resistance calculated from the slope Re(B) vs. L line, $R_{SH}=400$ Ω/Sq. Using Equation (3) and the intercept at spacing L=0, the channel sheet resistance under the metal electrode, $R_{SHc}=3R_CW/L_C \approx 300$ Ω/Sq.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of extracting a set of parameters of an evaluation structure, the method comprising:
   applying a first radio frequency (RF) signal through a first capacitive contact and a second capacitive contact to the evaluation structure, wherein the first and second capacitive contacts are separated by a first channel having a first spacing, and wherein each of the first and second capacitive contacts forms a capacitive coupling with a semiconductor of the evaluation structure;

acquiring measurement data corresponding to an impedance between the first and second capacitive contacts using the first and second capacitive contacts while the first RF signal is applied; and extracting the set of parameters from the measurement data.

2. The method of claim 1, further comprising:

applying a second RF signal through a third capacitive contact and a fourth capacitive contact to the evaluation structure, wherein the third and fourth capacitive contacts are separated by a second channel having a second spacing different from the first spacing; and acquiring measurement data corresponding to an impedance between the third and fourth capacitive contacts using the third and fourth capacitive contacts while the second RF signal is applied.

3. The method of claim 1, wherein the evaluation structure comprises a semiconductor film, and wherein the first and second capacitive contacts are applied to a surface of the semiconductor film.

4. The method of claim 1, further comprising applying a first test element to a surface of the evaluation structure, the first test element forming the first capacitive contact and the second capacitive contact.

5. The method of claim 4, wherein the applying comprises mechanically attaching the first test element to the surface of the evaluation structure.

6. The method of claim 4, wherein the applying comprises forming the first capacitive contact and the second capacitive contact on the surface of the evaluation structure.

7. The method of claim 4, further comprising applying a ground electrode to at least one of: the surface of the evaluation structure or an opposing surface of the evaluation structure.

8. The method of claim 1, further comprising applying a voltage bias to at least one of: the first capacitive contact or the second capacitive contact while the first RF signal is applied.

9. The method of claim 1, further comprising radiating the evaluation structure while the first RF signal is applied.

10. A test structure comprising:

a dielectric layer having a surface;

a test element located on the surface of the dielectric layer, the test element including:

a radio frequency (RF) input capacitive contact located on the surface of the dielectric layer; and a RF output capacitive contact located on the surface of the dielectric layer, wherein the RF input and RF output capacitive contacts are separated by a first channel having a first spacing;

a RF signal source electrically attached to the RF input capacitive contact; and a RF load electrically attached to the RF output capacitive contact.

11. The test structure of claim 10, the test element further including at least one ground electrode formed on the surface of the dielectric layer.

12. The test structure of claim 10, further comprising a second test element formed on the surface of the dielectric layer, wherein a second channel separating a RF input capacitive contact and a RF output capacitive contact of the second test element has a second spacing different from the first spacing.

13. The test structure of claim 10, further comprising an evaluation structure, wherein one of: the dielectric layer or the test element is mechanically attached directly to a surface of the evaluation structure, and wherein each of the input and output capacitive contacts forms a capacitive contact to a semiconductor of the evaluation structure.

14. The test structure of claim 13, wherein the evaluation structure comprises a semiconductor film, and the surface of the evaluation structure comprises a surface of the semiconductor film.

15. The test structure of claim 10, wherein each of the input and output capacitive contacts is a planar contact.

16. A testing environment comprising:

an evaluation structure;

a radio frequency (RF) input capacitive contact applied to a surface of the evaluation structure; and a RF output capacitive contact applied to the surface of the evaluation structure, wherein the input and output capacitive contacts are separated by a first channel having a first spacing and wherein each of the input and output capacitive contacts forms a capacitive coupling with a semiconductor of the evaluation structure;

a RF signal source electrically attached to the RF input capacitive contact;

a RF load electrically attached to the RF output capacitive contact; and a measurement device configured to acquire measurement data corresponding to an impedance of the evaluation structure using the RF input and RF output capacitive contacts while the RF signal source applies an RF signal.

17. The testing environment of claim 16, wherein the evaluation structure comprises a semiconductor film, and wherein the input and output capacitive contacts are applied to a surface of the semiconductor film.

18. The testing environment of claim 16, wherein the evaluation structure comprises a compound dielectric-semiconductor.

19. The testing environment of claim 16, wherein the evaluation structure comprises a wide bandgap heterostructure.

20. The testing environment of claim 16, further comprising a computer system configured to extract a set of parameters of the evaluation structure from the measurement data corresponding to the impedance of the evaluation structure.

21. The testing environment of claim 20, wherein the data corresponding to the impedance of the evaluation structure comprises S-parameter measurement data, and wherein the computer system extracts the set of parameters by converting the S-parameter measurement data to an ABCD matrix, and extracting the set of parameters of the evaluation structure using a B-parameter of the ABCD matrix.

* * * * *